United States Patent [19]
Snowman et al.

[11] Patent Number: 5,993,734
[45] Date of Patent: Nov. 30, 1999

[54] METHOD FOR MAKING W/TI SPUTTERING TARGETS AND PRODUCTS IN AN INERT ATMOSPHERE

[75] Inventors: Alfred Snowman, Englewood, N.J.; Thomas J. Hunt, Peekskill, N.Y.

[73] Assignees: Sony Corporation, Tokyo, Japan; Materials Research Corporation, Orangeburg, N.Y.

[21] Appl. No.: 09/047,849

[22] Filed: Mar. 25, 1998

[51] Int. Cl.$^6$ .................... B22F 3/14; C22C 1/04; C22C 14/00
[52] U.S. Cl. .................. 419/48; 419/54; 419/57; 75/248
[58] Field of Search .................. 419/48, 54, 57; 75/248

[56] References Cited

U.S. PATENT DOCUMENTS 5,863,398   1/1999   Kardokus et al. .................. 204/298.13

*Primary Examiner*—Daniel J. Jenkins
*Attorney, Agent, or Firm*—Wood, Herron & Evans, L.L.P.

[57] ABSTRACT

The invention relates to the manufacture of sputtering targets of tungsten-titanium alloy using high purity tungsten and titanium hydride powders. The powders are blended and placed in a containment vessel holding a die. The die is heated to a temperature of about 700° C. to about 1000° C. in an argon atmosphere while under pressure. The combination of temperature and pressure is high enough to dehydrate the titanium hydride and to remove the gases. The die is then heated to a higher temperature, in the range of about 1250° C. to 1350° C. while the pressure is increased so as to compact and alloy the powders. The pressure and temperature are held constant until there is no further movement of the ram. The resulting compacted alloy material is then machined to provide a sputtering target with a density between 96% and 100% of theoretical and a gas content less than 850 p.p.m. In a further feature of the present invention, a tungsten-titanium hydride powder may be used as the raw material for manufacturing the target. The raw materials of the present invention may be obtained by recycling used titanium targets or used tungsten-titanium targets.

45 Claims, 1 Drawing Sheet

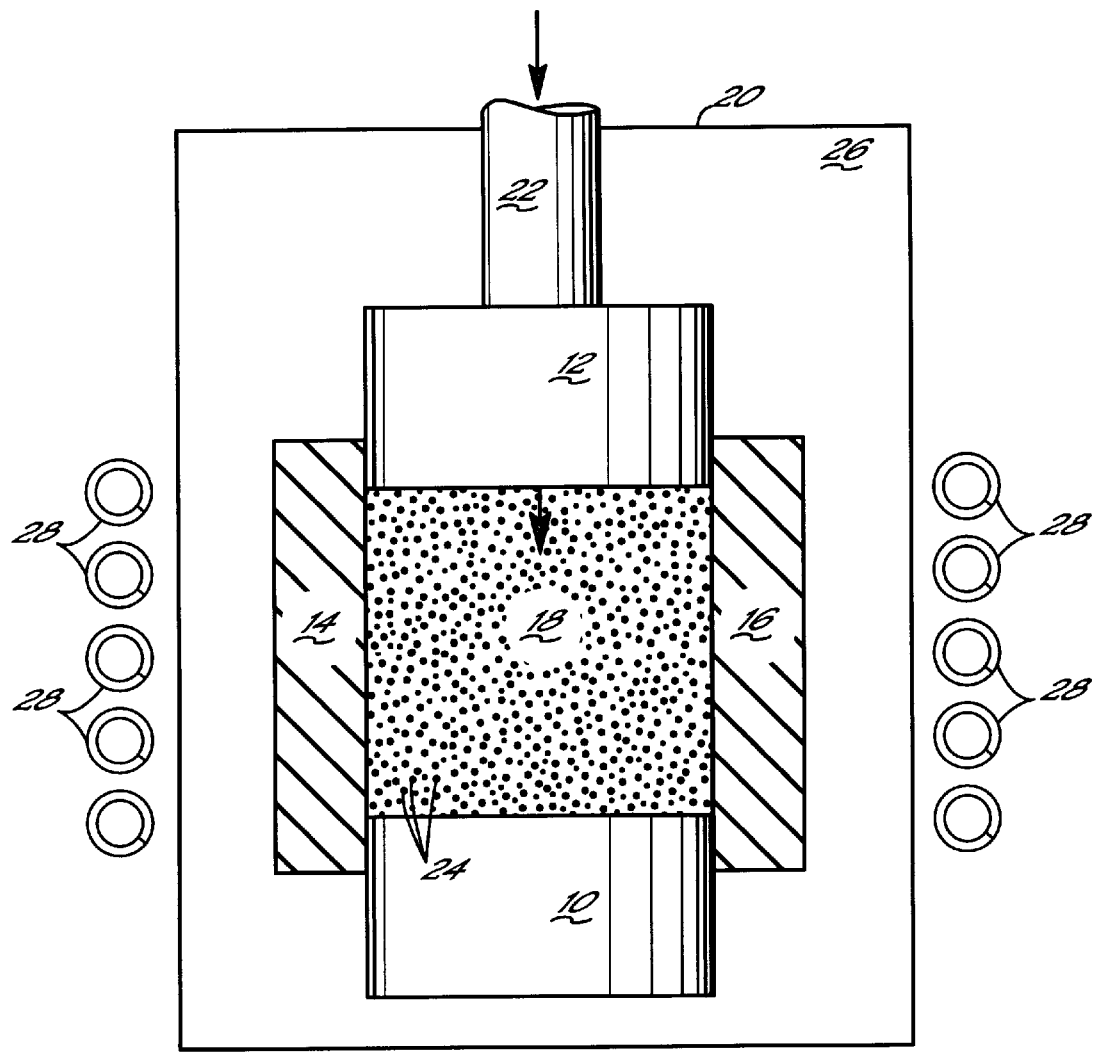

METHOD FOR MAKING W/TI SPUTTERING TARGETS AND PRODUCTS IN AN INERT ATMOSPHERE

FIELD OF THE INVENTION

This invention relates to the manufacture of W/Ti sputtering targets for use in the thin film coating of substrates with a W/Ti alloy.

BACKGROUND OF THE INVENTION

Sputtering is a coating process involving the transport of a material from a source (target) to a substrate. The process takes place in a reduced pressure atmosphere of argon gas (a partial vacuum). Particles of the source material are dislodged from the target surface by bombarding the surface with argon gas ions. These dislodged particles travel through the vacuum and are deposited on the substrate as a thin film. Sputtering technology is of great use in the semiconductor industry.

In the past, pure metal powders have been used in the manufacturing process for sputtering targets. Due to the limited useful life of sputtering targets, however, recent efforts have been made toward reducing the costs of manufacturing by recycling used targets and replacing the expensive pure metal powders with the recycled material. In the area of tungsten-titanium (W/Ti) thin film coatings, efforts have been directed to the recycling of used Ti targets.

In one process, used Ti metal is converted to titanium hydride ($TiH_2$) powder, typically by adding hydrogen in a furnace at a high temperature while agitating the metal. The Ti powder is then dehydrated in the same furnace in one continuous operation. This recycled Ti powder, having no hydrogen content as a result of the dehydration step, can then be used with pure W powder for the subsequent manufacture of a W/Ti sputtering target. A second process similarly involves converting used Ti metal to $TiH_2$ powder and dehydrating the powder to Ti powder, but instead performs these steps in two separate operations, involving an intermediate transfer of the material from one vessel to another.

The first process, in which a single operation is performed, has the disadvantage of being very time consuming, resulting in high production costs and delay in the manufacturing of the final target product. The second process not only has the disadvantage of being very time consuming, but also increases the risk of material contamination during the transfer of the material. Furthermore, the dehydration step in these processes involves the rotation and agitation of the powder in a rotary furnace, which has a molybdenum lining. The rotation and agitation wears and abrades the lining, causing contamination of the Ti powder. Targets manufactured from the recycled Ti metal are also frequently rejected due to high gas (oxygen) content.

SUMMARY OF THE INVENTION

The present invention provides a method for manufacturing W/Ti sputtering targets from a hydride powder by pressing the powder in a multi-step process under a protective gas atmosphere at elevated temperatures, avoiding the need for dehydration of the hydride powder in a costly, time consuming, separate operation, and avoiding contamination of the raw materials. The present invention permits the use of used Ti targets that have been recycled by conversion to $TiH_2$ by blending the $TiH_2$ with W powder, placing the blended powder in a die set in a containment vessel in which an ultra-high purity argon atmosphere exists, and subjecting the powder to a series of heat/pressure cycles that dehydrate, compact and alloy the blended powder. Thus, the $TiH_2$ is dehydrated during the manufacturing process of the target, rather than in a separate operation preceding the target manufacture. In a further feature of the present invention, used W/Ti targets that have been recycled by conversion to W-$TiH_2$ may be used, further reducing the costs of the raw materials. The result of the method of the present invention is a high density W/Ti sputter target produced directly from a hydride material at low cost and exhibiting improved titanium distribution and reduced gas content.

These and other objects and advantages of the present invention shall become more apparent from the accompanying drawings and description thereof.

BRIEF DESCRIPTION OF THE DRAWINGS

The accompanying drawing, which is incorporated in and constitutes a part of this specification, illustrates an embodiment of the invention and, together with a general description of the invention given above, and the detailed description given below, serves to explain the principles of the invention.

The FIGURE is a schematic of a die set for compacting powder into a target.

DETAILED DESCRIPTION

The present invention provides a method for the manufacture of W/Ti sputtering targets where pure Ti powder is replaced by $TiH_2$ powder. The $TiH_2$ powder may be purchased or may be obtained by converting used Ti targets to $TiH_2$ by a typical recycling process. The $TiH_2$ powder having an average particle size of 150 $\mu$m or less is then combined with W powder having an average particle size of 150 $\mu$m or less, preferably 50 $\mu$m or less, and more preferably 44 $\mu$m or less in a clean container having a sealable top. The ratio of W powder to $TiH_2$ powder should be sufficient to provide a W/Ti target with Ti content between 10 and 18% by weight, as specified. The container should be sealed in a chamber, such as a glove box, having an argon positive pressure inside, or other inert gas pressure, to protect the powder from contamination and oxidation. The container is preferably a blending can made from stainless steel, but any other suitable non-contaminating material may be used. Once sealed in the container, the powders are blended for a predetermined amount of time, preferably 1 to 4 hours. The blending is preferably done by a turbulent blending process, which typically involves the container being turned end over end, without the use of a blending media.

If necessary, in the same chamber with the protective argon atmosphere, the resulting W/$TiH_2$ blended powder is transferred to a second container in order to reduce the average particle size to 150 $\mu$m or less, preferably 50 $\mu$m or less, and more preferably 44 $\mu$m or less. A smaller average particle size will result in better contact between individual particles, and ultimately a more compacted target. The preferred method of reduction is the use of a ball mill jar containing a predetermined amount of ball mill media. For example, a Ti ball mill jar containing Ti cylinders of ½ inch diameter and ½ inch height in a quantity approximately equal to the quantity of W/$TiH_2$ blended powder may be used. Ball mill cans and media of varying sizes and shapes may also be used, and may be made of other suitable non-contaminating materials. The container is sealed and the powder subjected to ball milling for a time sufficient to reduce the average particle size to the desired value, typically by repeatedly tumbling or rotating the container on a stand, which includes a number of rotationally driven rollers on which the container is positioned and supported. The amount of time for reduction is dependent on the desired size, the amount of powder and ball mill media and the speed of rotation of the container, but is generally at least 4 hours to reduce to 44 μm or less, and typically between 4 and 12 hours. For example, with a media to powder ratio of 2:1 and a rotational speed of 50–60 rpm, the minimum amount of time for reduction to 44 μm is 4 hours.

With reference to FIG. 1, die components, including a die base 10, a die top 12, and die rings 14, 16, are assembled to form a die set 18 within a containment vessel 20, preferably a press chamber having a pressure ram 22, and the W/TiH$_2$ blended powder 24 is loaded into the die set 18. The die components 10, 12, 14, 16 are made from graphite, per industry standards, and have been vacuum annealed to remove any volatiles, such as calcium, sodium and sulfur. The vessel 20 is closed and purged of oxygen by an argon flow of 180 to 220 SCHF, with 200 SCHF preferred, for 10 to 30 minutes to obtain an ultra-high purity argon atmosphere 26. Alternatively, the vessel may be purged with any inert gas, although argon is the most common and practical, and is preferred in the present invention. The W/TiH$_2$ blended powder is now ready to be pressed and alloyed by the multi-step process of the present invention.

While the argon flow continues, an initial containment pressure of 1.3 to 4.2 MPa, preferably 2.75 MPa, is applied to the powder 24. A first heat/pressure cycle is then applied to the vessel 20, related die components 10, 12, 14, 16 and W/TiH$_2$ blended powder 24. This first cycle involves applying sufficient heat to the powder to elevate the powder temperature to a temperature in a range of 1250° C. to 1350° C., preferably 1300° C., in the vessel while continuing the argon flow. Preferably, induction heating is used by means of coils 28 surrounding the vessel 20. It is to be understood, however, that any other suitable heating means may be used. The pressure used in the first cycle is dependent on the product configuration, and may be as low as 6.8 MPa and as high as 25 MPa. In any configuration, the preferred operating range is ±2.75 MPa. Upon completion of the first heat/pressure cycle, which typically takes 1 to 3 hours, the vessel 20 is cooled to room temperature.

While the vessel 20 is still under a continuous argon flow, a second heat/pressure cycle is started. The vessel 20, related die components 10, 12, 14, 16 and W/TiH$_2$ blended powder 24 are heated to a temperature between about 700° C. and 1000° C. and a pressure of between about 6.8 and 11 MPa is applied to the powder 24. A constant temperature and pressure are maintained for a time sufficient to remove the hydrogen and other gases, such as oxygen, from the powder 24, resulting in a W/Ti blended powder. Typically, the time period is at least 2 hours.

While the vessel 20 is still under a continuous argon flow, a third heat/pressure cycle is started. The vessel 20, related die components 10, 12, 14, 16 and W/Ti blended powder 24 are heated to a temperature between about 1250° C. and 1350° C. and a pressure of between about 11 and 16.5 MPa, preferably about 13.75 MPa, is applied to compact and alloy the material. The third heat/pressure cycle is maintained until there is no further movement of the pressure ram 22, indicating that the material is fully compacted. This typically takes at least 7 hours. If the cycle is stopped prematurely, the density of the target will be compromised.

When the powder 24 is fully compacted, the heat is turned off, the pressure is relieved and the vessel 20 and related materials are allowed to cool to room temperature. The argon flow is subsequently stopped. The die set 18 is then disassembled and the target is machined to final dimensions. The resulting machined sputtering target has a density of greater than 95% theoretical and a gas content (oxygen, nitrogen and hydrogen) of less than 850 p.p.m.

In a further feature of the present invention, a method is provided for the manufacture of W/Ti sputtering targets where pure Ti powder and pure W powder are replaced by W-TiH$_2$ powder. The W-TiH$_2$ powder may be purchased or may be obtained by converting used W/Ti targets to W-TiH$_2$ by a typical recycling process. A blending step is no longer necessary, because the tungsten is already present in the recycled material.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. For example, the invention may be modified with powder of differing particle size distributions. The blending and particle size reducing methods may also be replaced with other suitable methods. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method for the manufacture of W/Ti sputtering targets comprising the steps of:

placing a W powder and a TiH$_2$ powder in a container located in an inert gas atmosphere;

blending the W powder and the TiH$_2$ powder to form a blended powder;

reducing the particle size of the blended powder to approximately 150 μm or less;

placing the blended powder in a die held within a containment vessel having a ram, and purging the vessel with an inert gas flow;

subjecting the blended powder to a containment pressure of about 1.3 to 4.2 MPa;

subjecting the containment vessel, die and blended powder, while continuing the inert gas flow, to a first heat/pressure cycle consisting of applying a first pressure of about 6.8 to 25 MPa to the blended powder and heating to a first temperature of about 1250° C. to about 1350° C., followed by cooling to room temperature;

subjecting the containment vessel, die and blended powder, while continuing the inert gas flow, to a second heat/pressure cycle consisting of a second temperature and a second pressure sufficient to dehydrate the TiH$_2$ and to remove any other gases, forming a dehydrated blended powder;

subjecting the containment vessel, die and dehydrated blended powder, while continuing the inert gas flow, to a third heat/pressure cycle consisting of heating the die to a third temperature higher than said second temperature, and concurrently increasing the pressure to a third pressure higher than said second pressure so as to compact and alloy the dehydrated blended powder; and releasing the third pressure, cooling the containment vessel to room temperature, and subsequently stopping the inert gas flow.

2. The method of claim 1, wherein the container is a blending can.

3. The method of claim 1, wherein the blending is a turbulent blending procedure.

4. The method of claim 1, wherein the blending is performed for 1 to 4 hours.

5. The method of claim 1, wherein the inert gas is argon.

6. The method of claim 1, wherein the particle size of the blended powder is reduced to 50 μm or less.

7. The method of claim 1, wherein reducing the particle size is accomplished by ball milling in a ball mill jar.

8. The method of claim 7, wherein the ball milling is performed for at least 4 hours.

9. The method of claim 1, wherein the die is made up of graphite die components that have been vacuum annealed.

10. The method of claim 1, wherein the containment pressure is 2.75 MPa.

11. The method of claim 1, wherein the second heat/pressure cycle consists of heating the die to a second temperature of about 700° C. to 1000° C. and applying a second pressure of about 6.8 to 11 MPa, wherein the combination of the second temperature and the second pressure is sufficient to dehydrate the $TiH_2$ and to remove any other gases.

12. The method of claim 1, wherein the second heat/pressure cycle is maintained for about 2 hours or more.

13. The method of claim 1, wherein the third heat/pressure cycle is maintained until there is no further movement of the ram.

14. The method of claim 13, wherein the third heat/pressure cycle is maintained for at least 7 hours.

15. The method of claim 1, wherein the third pressure is about 40 to 11 to 16.5 MPa.

16. The method of claim 1, wherein the third temperature is in the range of 1250° C. to 1350° C.

17. A W/Ti sputtering target manufactured by the method of claim 1 having a density of greater than 95% theoretical and a gas content of less than 850 p.p.m.

18. A method for the manufacture of W/Ti sputtering targets comprising the steps of:

placing a W powder and a $TiH_2$ powder in a first container held inside a chamber having an argon atmosphere;

blending the W powder and the $TiH_2$ powder for about 1 to 4 hours to form a blended powder;

transferring the blended powder within the chamber to a second container containing a predetermined amount of ball mill media and ball milling the blended powder for a time sufficient to reduce the particle size of the blended powder to about 50 μm or less;

placing the blended powder in a die held within a containment vessel having a ram, and purging the vessel with an argon flow;

subjecting the blended powder to a containment pressure of about 1.3 to 4.2 MPa;

subjecting the containment vessel, die and blended powder, while continuing the argon flow, to a first heat/pressure cycle consisting of applying a first containment pressure of about 6.8 to 25 MPa to the blended powder and heating to a first temperature of about 1250° C. to 1350° C., followed by cooling to room temperature;

subjecting the containment vessel, die and blended powder, while continuing the argon flow, to a second heat/pressure cycle consisting of heating the die to a second temperature of about 700° C. to 1000° C. and applying a second pressure of about 6.8 to 11 MPa, wherein the combination of the second temperature and second pressure is sufficient to dehydrate the $TiH_2$ and to remove any other gases, forming a dehydrated blended powder;

maintaining a second temperature and second pressure for about 2 hours or more;

subjecting the containment vessel, die and dehydrated blended powder, while continuing the argon flow, to a third heat/pressure cycle consisting of heating the die to a third temperature in the range of 1250° C. to 1350° C. and concurrently increasing the pressure to a third pressure of about 11 to 16.5 MPa so as to compact and alloy the dehydrated blended powder;

maintaining a third temperature and third pressure until there is no further movement of the ram; and releasing the third pressure, cooling the containment vessel to room temperature and subsequently stopping the argon flow.

19. The method of claim 18, wherein the first container is a blending can.

20. The method of claim 18, wherein the blending is a turbulent blending procedure.

21. The method of claim 18, wherein amount of ball mill media is approximately equal to the amount of blended powder.

22. The method of claim 18, wherein the ball milling is performed for at least 4 hours.

23. The method of claim 18, wherein the die is made up of graphite die components that have been vacuum annealed.

24. The method of claim 18, wherein the third heat/pressure cycle is maintained for at least 7 hours.

25. A W/Ti sputtering target manufactured by the method of claim 18 having a density of greater than 95% theoretical and a gas content of less than 850 p.p.m.

26. A method for the manufacture of W/Ti sputtering targets comprising the steps of:

placing a W-$TiH_2$ powder in a chamber having an inert gas atmosphere;

reducing the particle size of the W-$TiH_2$ powder to 150 μm or less;

placing the W-$TiH_2$ powder in a die held within a containment vessel having a ram, and purging the vessel with an inert gas flow;

subjecting the W-$TiH_2$ powder to a containment pressure of about 1.3 to 4.2 MPa;

subjecting the containment vessel, die and W-$TiH_2$ powder, while continuing the inert gas flow, to a first heat/pressure cycle consisting of applying a first pressure of about 6.8 to 25 MPa to the W-$TiH_2$ powder and heating to a first temperature of about 1250° C. to 1350° C., followed by cooling to room temperature;

subjecting the containment vessel, die and W-$TiH_2$ powder, while continuing the inert gas flow, to a second heat/pressure cycle consisting of a second temperature and a second pressure sufficient to dehydrate the W-$TiH_2$ powder and to remove any other gases, forming a W-Ti powder;

subjecting the containment vessel, die and W-Ti powder, while continuing the inert gas flow, to a third heat/pressure cycle consisting of heating the die to a third temperature higher than said second temperature, and concurrently increasing the pressure to a third pressure higher than said second pressure so as to compact and alloy the W-Ti powder; and releasing the third pressure, cooling the containment vessel to room temperature and subsequently stopping the inert gas flow.

27. The method of claim 26, wherein the inert gas is argon.

28. The method of claim 26, wherein the particle size of the blended powder is reduced to 50 μm or less.

29. The method of claim 26, wherein reducing the particle size is accomplished by ball milling in a ball mill jar.

30. The method of claim 29, wherein the ball milling is performed for at least 4 hours.

31. The method of claim 26, wherein the die is made up of graphite die components that have been vacuum annealed.

32. The method of claim 26, wherein the containment pressure is 2.75 MPa.

33. The method of claim 26, wherein the second heat/pressure cycle consists of heating the die to a second temperature of about 700° C. to 1000° C. and applying a second pressure of about 6.8 to 11 MPa, wherein the combination of the second temperature and the second pressure is sufficient to dehydrate the $TiH_2$ and to remove any other gases.

34. The method of claim 26, wherein the second heat/pressure cycle is maintained for about 2 hours or more.

35. The method of claim 26, wherein the third heat/pressure cycle is maintained until there is no further movement of the ram.

36. The method of claim 35, wherein the third heat/pressure cycle is maintained for at least 7 hours.

37. The method of claim 26, wherein the third pressure is about 11 to 16.5 MPa.

38. The method of claim 26, wherein the third temperature is in the range of 1250° C. to 1350° C.

39. A W/Ti sputtering target manufactured by the method of claim 26 having a density of greater than 95% theoretical and a gas content of less than 850 p.p.m.

40. A method for the manufacture of W/Ti sputtering targets comprising the steps of:

placing a W-$TiH_2$ powder in a container held inside a chamber having an argon atmosphere, said container containing a predetermined amount of ball mill media;

ball milling the W-$TiH_2$ powder for a time sufficient to reduce the particle size of the W-$TiH_2$ powder to about 50 μm or less;

placing the W-$TiH_2$ powder in a die held within a containment vessel having a ram, and purging the vessel with an argon flow;

subjecting the W-$TiH_2$ powder to a containment pressure of about 1.3 to 4.2 MPa;

subjecting the containment vessel, die and W-$TiH_2$ powder, while continuing the argon flow, to a first heat/pressure cycle consisting of applying a first pressure of about 1.3 to 4.2 MPa to the blended powder and heating to a first temperature of about 1250° C. to 1350° C., followed by cooling to room temperature;

subjecting the containment vessel, die and W-$TiH_2$ powder, while continuing the argon flow, to a second heat/pressure cycle consisting of heating the die to a second temperature of about 700° C. to 1000° C. and applying a second pressure of about 6.8 to 11 MPa, wherein the combination of the second temperature and second pressure is sufficient to dehydrate the $TiH_2$ and to remove any other gases, forming a W-Ti powder;

maintaining a second temperature and second pressure for about 2 hours or more;

subjecting the containment vessel, die and W-Ti powder, while continuing the argon flow, to a third heat/pressure cycle consisting of heating the die to a third temperature in the range of 1250° C. to 1350° C. and concurrently increasing the pressure to a third pressure of about 11 to 16.5 MPa so as to compact and alloy the W-Ti powder;

maintaining a third temperature and third pressure until there is no further movement of the ram; and releasing the third pressure, cooling the containment vessel to room temperature and subsequently stopping the argon flow.

41. The method of claim 40, wherein amount of ball mill media is approximately equal to the amount of W-$TiH_2$ powder.

42. The method of claim 40, wherein the ball milling is performed for at least 4 hours.

43. The method of claim 40, wherein the die is made up of graphite die components that have been vacuum annealed.

44. The method of claim 40, wherein the third heat/pressure cycle is maintained for at least 7 hours.

45. A W/Ti sputtering target manufactured by the method of claim 40 having a density of greater than 95% theoretical and a gas content of less than 850 p.p.m.

* * * * *